(12) United States Patent
Karandikar et al.

(10) Patent No.: US 7,426,952 B2
(45) Date of Patent: Sep. 23, 2008

(54) BONDING FLEXIBLE FILM CIRCUIT AND ELECTRONIC CIRCUIT BOARD

(75) Inventors: Bhalchandra M. Karandikar, Tigard, OR (US); Jonathan R. Brick, Tualatin, OR (US); Richard Schmachtenberg, III, Aloha, OR (US)

(73) Assignee: Xerox Corporation, Norwalk, CT (US)

( * ) Notice: Subject to any disclaimer, the term of this patent is extended or adjusted under 35 U.S.C. 154(b) by 381 days.

(21) Appl. No.: 11/008,490

(22) Filed: Dec. 9, 2004

(65) Prior Publication Data
US 2005/0098270 A1    May 12, 2005

Related U.S. Application Data

(62) Division of application No. 10/322,113, filed on Dec. 17, 2002, now abandoned.

(51) Int. Cl.
*B29C 65/00* (2006.01)
*B32B 37/00* (2006.01)

(52) U.S. Cl. .............. 156/580; 156/583.1; 100/193; 100/258 R

(58) Field of Classification Search .......... 100/324, 100/325, 193, 208, 237, 137, 138, 194, 207, 100/258 A, 258 R, 302; 156/580, 583.1, 156/583.6, 583.7, 583.91
See application file for complete search history.

(56) References Cited

U.S. PATENT DOCUMENTS

| | | | | |
|---|---|---|---|---|
| 1,008,556 A * | 11/1911 | Pancoast | ................ | 100/193 |
| 1,327,815 A | 1/1920 | Francis | ................ | 100/193 |
| 3,594,867 A * | 7/1971 | Pfeiffer | ................ | 425/143 |
| 3,607,522 A * | 9/1971 | Phillips et al. | ............... | 156/209 |
| 4,406,719 A * | 9/1983 | Mitsumoto et al. | ............ | 156/52 |
| 4,543,147 A * | 9/1985 | Noto et al. | ................ | 156/288 |
| 5,183,969 A | 2/1993 | Odashima | ................ | 174/88 R |
| 5,203,075 A | 4/1993 | Angulas et al. | ............... | 29/830 |
| 5,288,959 A | 2/1994 | Henschen | ............... | 219/616 |
| 5,357,084 A | 10/1994 | McKee et al. | ............... | 219/605 |
| 5,425,838 A * | 6/1995 | Chenoweth et al. | ....... | 156/583.4 |
| 5,641,371 A * | 6/1997 | Sanko | ................... | 156/228 |
| 5,672,400 A | 9/1997 | Hansen et al. | ............. | 428/40.1 |
| 5,799,392 A | 9/1998 | Mishiro | ................... | 29/830 |
| 6,226,862 B1 | 5/2001 | Neuman | ................... | 29/830 |
| 6,475,314 B1 | 11/2002 | Yoshihiro et al. | .......... | 428/41.8 |

OTHER PUBLICATIONS

Microjoin, Ceramic Hot Bar Technology Advances Bonding Repeatability, brochure (?), approx. Dec. 6, 1999, Microjoin, Inc. Poway, CA.

Mike Szuch, Hot Bar Soldering Flex to PCBs, SMT, approx. Aug. 1998, IHS Publishing Group, Libertyville, IL.

DCI, Inc., 1093C Heat Seal Press Operations Manual, approx. Nov. 11, 1998, DCI, Inc., Lenexa, KS.

* cited by examiner

*Primary Examiner*—John L Goff
(74) *Attorney, Agent, or Firm*—Maginot, Moore & Beck

(57) ABSTRACT

Two circuit bearing substrates, such as a rigid electronic circuit board and a flexible circuit film, each having large arrays or multiple arrays of surface contact pads or traces, are mechanically and electrically joined without relocating the substrates during the bonding process by using a bonding apparatus with multiple working tools or bond shoes. The bonding apparatus includes a fixture for holding the circuit bearing substrates with a joining layer between them, and two or more independently operated heated bond shoes that compress different portions of the circuit bearing substrates with the joining layer, such as a layer of anisotropic conductive film.

16 Claims, 4 Drawing Sheets

BONDING FLEXIBLE FILM CIRCUIT AND ELECTRONIC CIRCUIT BOARD

This is a divisional of U.S. application Ser. No. 10/322,113 filed Dec. 17, 2002, now abandoned, by Bhalchandra M. Karandikar, Jonathan R. Brick, and Richard Schmachtenberg III, and claims priority therefrom. This divisional application is being filed in response to a restriction requirement in that prior application.

BACKGROUND

This invention relates to electrically and mechanically joining a relatively flexible circuit-bearing element to a relatively inflexible circuit-bearing element, each having multiple arrays of closely spaced electrically conductive traces.

Electrical and electronic devices often formed by joining together separate elements, each containing electronic circuitry. The separate elements are electrically connected by providing each element with electrical contact pads or traces, aligning the contact pads or traces on one element with the corresponding contact pads on the other element, and then bonding the elements together in a manner that provides electrical conductivity between the aligned contact pads or traces.

One combination of circuit elements is a rigid or inflexible substrate, such as an electronic circuit board, bearing electronic circuitry, joined to a circuit-bearing flexible substrate, such as a flexible circuit film. The circuitry on each substrate contains contact pads on the surface of the substrate. The flexible circuit film and the rigid electronic circuit board are joined by a joining layer between them. The joining layer is formed of a material, such as anisotropic conductive film, that, under compression, is electrically conductive in the direction of compression, but remains substantially insulating in the directions orthogonal to the direction of compression. Bonding the anisotropy conductive film between the rigid electronic circuit board and the flexible circuit film is performed by arranging the electronic circuit board, the anisotropy conductive film, and the flexible circuit film on a tabular fixture, and pressing a heated bond shoe onto the assembled elements. An exemplary bonding apparatus is available from DCI, Inc. of Lenexa, Kans., as Model No. 1093C Heat Seal Press.

An existing bonding apparatus uses a single heated bond shoe that is typically up to approximately 2-3 inches (5.0-7.5 cm) in length, and 0.3 inches in width to bond circuit elements having an array of contact pads up to the length of the bond shoe. However, some electronic devices contain circuit elements having arrays of contact pads in which the dimensions of the array exceed this bond shoe length. For example, a large printhead for an ink jet printer may have contact pads arranged in arrays that are up to 8-9 inches (20-23 cm) in length. In some instances, the arrays of contact pads may be quite dense (150 contact pads per inch) or the contact pads may be arranged in multiple rows along this length. Each of these circumstances requires that the bonding technique be highly accurate, to ensure the corresponding contact pads on the circuit elements are accurately connected electrically, and that non-corresponding contact pads are not improperly connected.

For joining large arrays of contact pads, two techniques have been available. One technique is to use a bond shoe that is as long as the array of contact pads. This technique requires that the face of the bond shoe be exceptionally flat, so that the bond shoe applies pressure evenly along the entire array of contact pads. The nature of the anisotropic conductive film is such that sections subjected to different forces of compression have different electrical conductivity. Variation in the face of the bond shoe may cause variations in the performance of the resulting electrical connections. The other technique is to use a standard sized bond shoe to bond one section of the array, then relocate the assembly of circuit elements on the fixture of the bonding apparatus, and use the same bond shoe to bond an adjacent section of the array. This technique requires accurately placing and the circuit bearing elements multiple times on the fixture during the bonding process. Each relocation of the circuit bearing elements creates a risk of damaging the elements, or of inaccurately aligning the connections between the elements. In addition, the repeated relocations of the circuit elements slow production processes.

SUMMARY

A bonding apparatus for electrically joining a first circuit bearing substrate, such as a rigid electronic circuit board having a first array of conductive surface traces, to a second circuit bearing substrate, such as a flexible circuit film having a second array of conductive surface traces, allows for joining large arrays of surface traces without relocating the circuit bearing substrates by using multiple bond shoes to compress different portions of the arrays. The apparatus includes a fixture having a fixture surface, first and second bond shoes, and one or more tool presses connected to the first and second working tools for selectively pressing the first bond shoe toward a first portion of the fixture surface and for selectively pressing the second bond shoe toward a second portion of the fixture surface. In particular embodiments, a first tool press is connected to the first working tool, and a second tool press is connected to the second working tool. The first tool presses each have a tacking mode of operation in which the first tool press presses the first bond shoe toward the first portion of the fixture surface with a tacking force, and a bonding mode of operation in which the second tool press presses the second bond shoe toward the second portion of the fixture surface with a bonding force, which bonding force is greater than the tacking force.

A method of electrically joining a first circuit bearing substrate having a first array of conductive surface traces to a second circuit bearing substrate having a second array of conductive surface traces provides for compressing different portions of the first and second circuit bearing substrates with different working tools. The method includes positioning on a fixture surface the first circuit bearing substrate, positioning the second circuit bearing substrate, and compressing different portions of the arrays of conductive surface traces between first and second working tools and the fixture surface.

DRAWINGS

DETAILED DESCRIPTION

Figure 1:
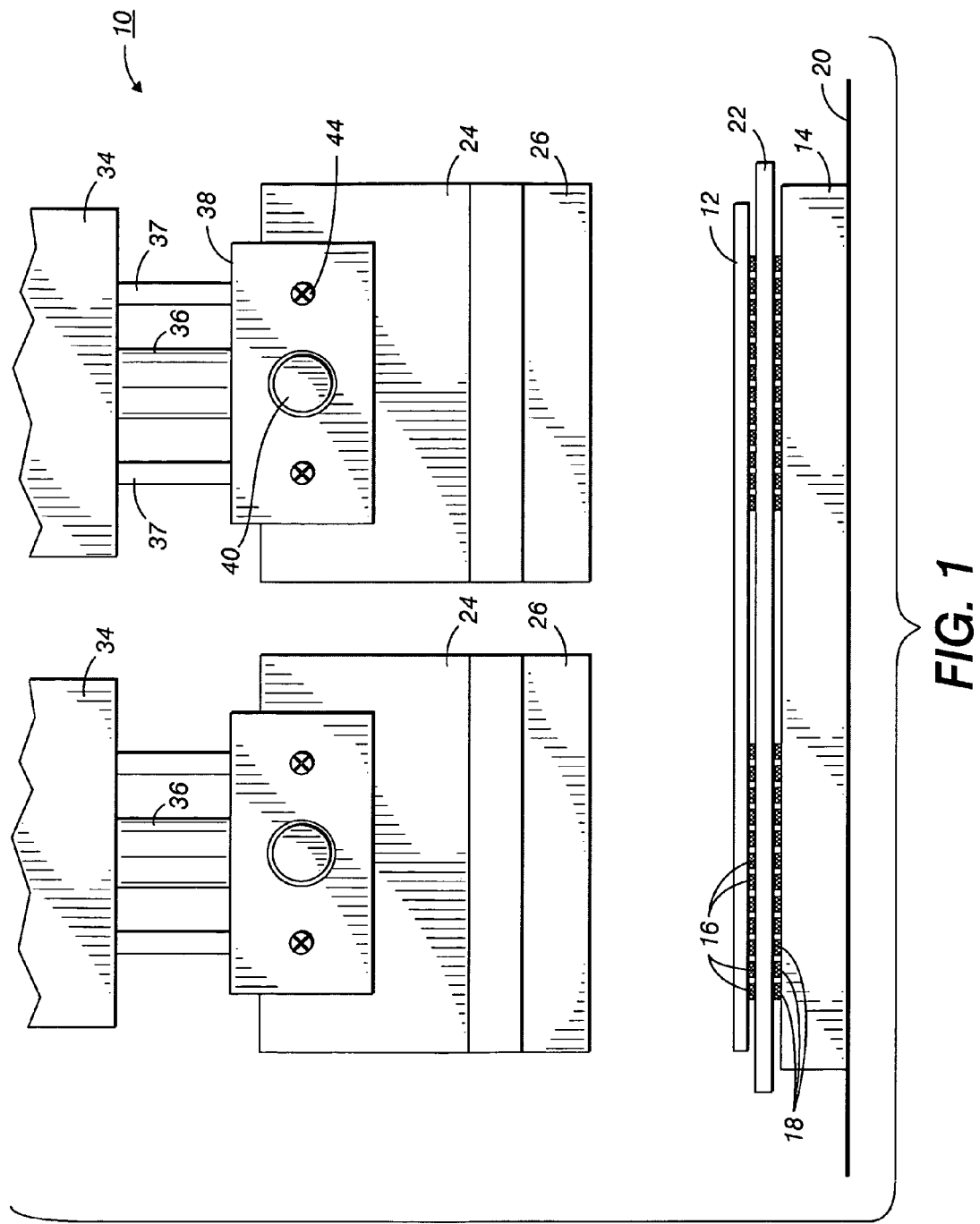
FIG. 1 is a frontal view of a circuit element bonding apparatus in an open position.
Figure 2:
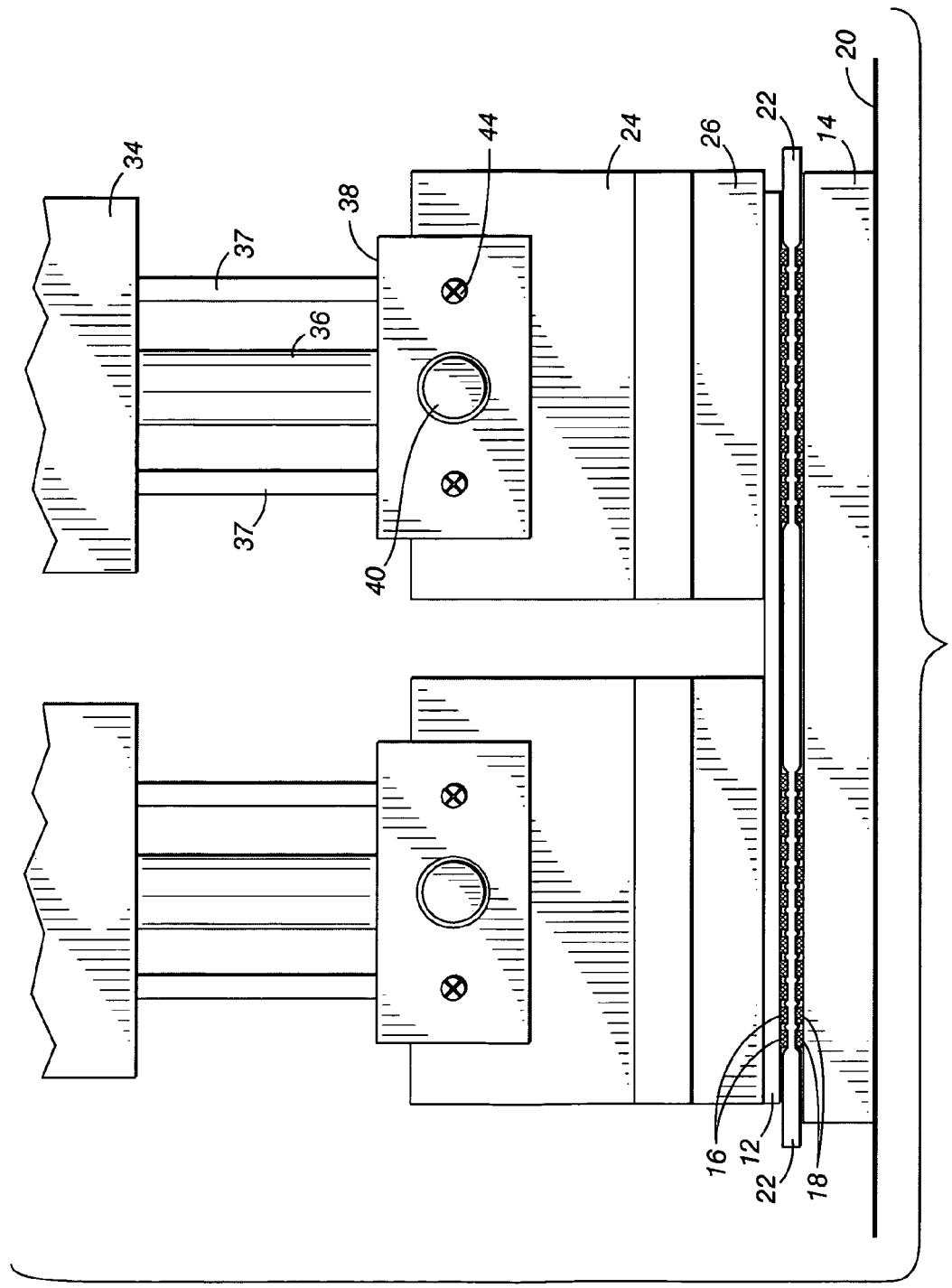
FIG. 2 is a frontal view of the bonding apparatus of FIG. 1 in a closed position.

FIGS. 1 and 2 show a bonding apparatus 10 for bonding a circuit-bearing flexible substrate, such as a flexible circuit film 12, to a circuit bearing inflexible substrate, such as an electronic circuit board 14. FIG. 1 shows the bonding apparatus in an "open" position. FIG. 2 shows the bonding apparatus in a "closed" position, in which it applies vertical force to the flexible circuit film 12 and the electronic circuit board 14.

The flexible circuit film 12 contains electronic circuitry (not shown), with a plurality of film contact pads or film surface traces 16 on one surface of the flexible circuit film providing electrical contact to portions of that electronic circuitry. The film surface traces 16 are electrically conductive. The flexible circuit film is formed of an organic polymer film, and is familiar to those skilled in the art. The electronic circuit board 14 also contains electronic circuitry (not shown). The electronic circuitry in the electronic circuit board may be formed on multiple interconnected layers of the electronic circuit board, as is familiar to those skilled in the art. Board contact pads or board surface traces 18 on at least one surface of the electronic circuit board provide electrical contact to portions of the electronic circuitry contained in the electronic circuit board. The board surface traces 18 are also electrically conductive. Each array of board surface traces and film surface traces may have at least approximately 20 traces per centimeter (50 traces per inch), and may have 40-100 traces per centimeter (100-250 traces per inch). Each array may have a length of up to approximately 10 cm (4 inches). In an example, the arrays of board surface traces are separated from one another by a space. The space between the arrays of surface traces can be sufficiently small that the arrays are immediately adjacent one another.

In the example illustrated, the film surface traces 16 and the board surface traces 18 are to be electrically joined so that electrical signals can flow between the board surface traces and the corresponding film surface traces. The board surface traces 18 are arranged in elongate arrays, and the film surface traces 16 are arranged in corresponding elongate arrays. Generally, the number and shapes of the board surface traces match the number and shapes of the film surface traces. The array dimensions of an array of film surface traces 16 closely or exactly matches the array dimensions of the corresponding array of board surface traces 18. In an example, one array of board surface traces has the same number of traces and the same array dimensions as an adjacent array of board surface traces. However, adjacent arrays of traces may have different numbers and shapes of traces, and have different array dimensions.

In the bonding apparatus of FIG. 1, the electronic circuit board 14 is secured to a fixture 20 with the surface containing the board surface traces 18 exposed (facing away from the fixture surface). The electronic circuit board 14 may be secured to the fixture with removable clamps (not shown) or other attachment mechanisms that are familiar to those skilled in the art. The flexible film is arranged with the exposed film surface traces 16 opposed to and facing the corresponding board surface traces.

A joining layer 22 is positioned between the electronic circuit board and the flexible film circuit. The joining layer 22, after bonding, electrically connects the film surface traces 16 and the board surface traces 18 to provide electrical interconnection between the circuits of the electronic circuit board and the circuits of the flexible circuit film. The joining layer 22 is not necessarily adhesive in nature, although an anisotropic conductive adhesive in the form of an anisotropic conductive film, may be used for the joining layer 22. Such anisotropic conductive film is sometimes called "z-axis tape." The anisotropic conductive film may be formed of an epoxy resin-based adhesive containing embedded metal particles that allow the material to become electrically conductive in a direction in which the material is compressed, but remain substantially insulating in the directions orthogonal to the direction of compression. Thus, in the case of an anisotropic conductive film as the joining layer 22, compressing the joining layer 22 in the vertical direction (z-axis), across the thickness of the film, causes the joining layer to become electrically conductive in the vertical direction, while remaining electrically substantially insulating in the horizontal directions (x-y plane), along the length and width of the film. Exemplary anisotropic conductive films include Hitachi AC2052P45, AC2054P35, and AP2101P35 available from Hitachi Chemical Company of Tokyo, Japan.

The bonding apparatus 10 includes two or more working tools, such as bond shoes 24, each of which corresponds to one of the corresponding arrays of film surface traces and board surface traces. The shoes 24 are substantially identical, except that certain dimensions may differ. The distal end of each shoe 24 has a working surface 26 that has lateral dimensions that equal or slightly exceed the dimensions of its corresponding arrays of film surface traces and board surface traces. In an example in which the multiple arrays of traces all have the same array dimensions, the working surfaces 26 of each shoe have the same dimensions. The face of the working surface 26 is substantially flat, so that when the working surface is pressed against the flexible circuit film (see FIG. 2), the working surface can apply uniform pressure across the entire array of film surface traces and board surface traces. The working surface 26 (and preferably the other parts of the shoe 24) is formed of a very hard thermally conductive material. The material of the working surface 26 is sufficiently hard to be able to withstand high pressures (up to at least 150 pounds per square inch) without deforming. In addition, the material of the working surface has substantially uniform thermal expansion characteristics in the vertical dimension (toward the face of the working surface) so that the face of the working surface remains substantially flat as the temperature of the working surface changes. For example, the working surface 26 (as well as other portions of the shoe 24) may be formed of carbon steel plated with Nickel. The face of the working surface 26 is generally less than 13 cm (5 inches) in length, is preferably up to approximately 11 cm (4.2 inches) in length, but may be smaller, such as 2.5-7.5 cm (1-3 inches) in length. The face of the working surface 26 may be greater than 11 cm (4.2 inches) in length, although the greater the length of the working surface face, the greater the difficulty in maintaining the flatness of the face. The working surface face may have a width of approximately 0.8-1.0 cm (0.3-0.4 inch). The dimensions of the face of the working surface of each shoe closely match the dimensions of the corresponding arrays of film surface traces and board surface traces. The face of the working surface may have the same dimensions as the cross-section of the upper portion of the bond shoe, or the face may have different dimensions the bond shoes may be configured so that the faces of the working surfaces of adjacent shoes have little or virtually no gap between them. Such a configuration allow adjacent shoes to bond an essentially continuous array of surface traces 16, 18. In an example, two adjacent bond shoes, each having a 10 cm (4 inch) working surface face, positioned immediately adjacent one another, can bond a single continuous array of surface traces up to 20 cm (8 inches) in length. The bond shoes may be positioned so that the separation between the faces of the working surfaces of adjacent bond shoes is 0.1-0.6 cm (0.05-0.25 inch).

Figure 3:
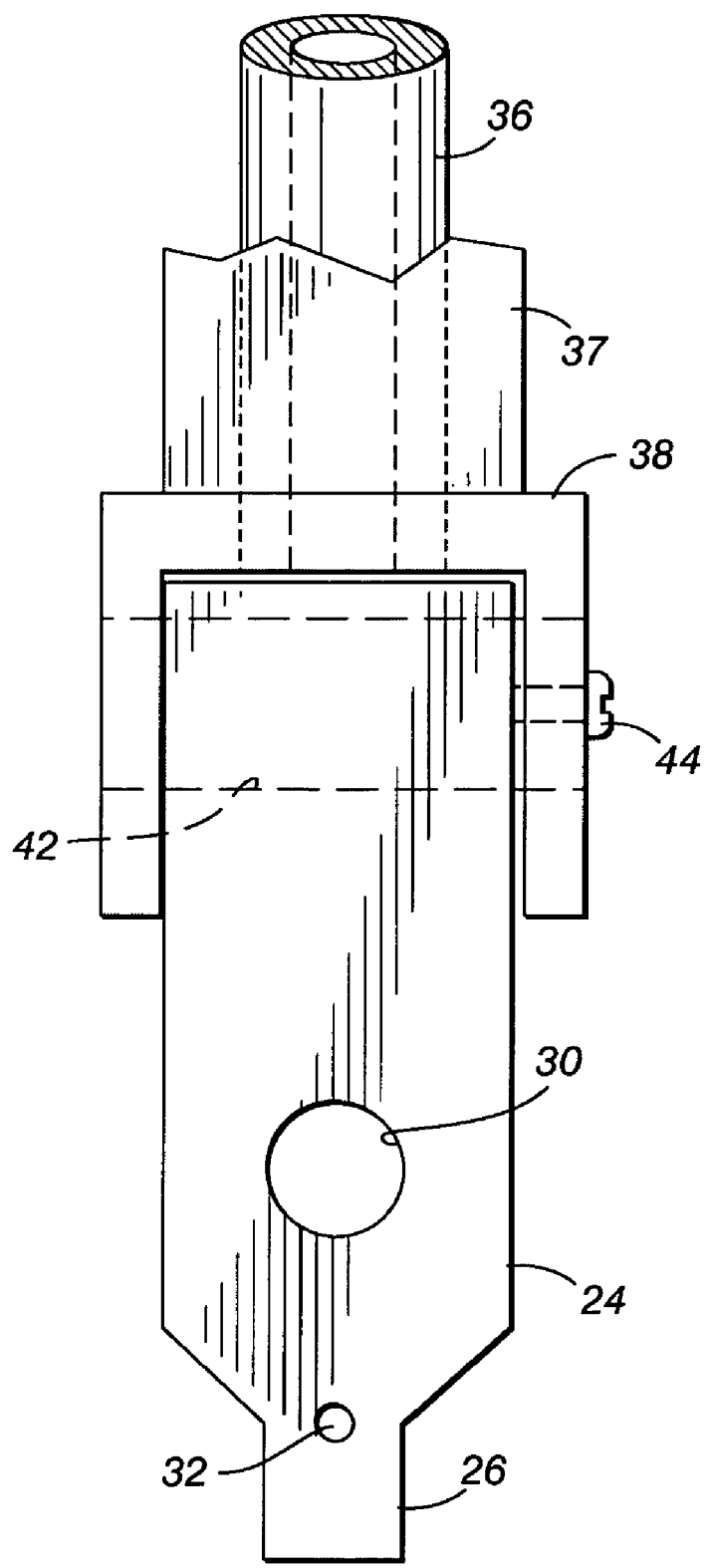
FIG. 3 is a side view of a bond shoe portion of the bonding apparatus of FIGS. 1 and 2.
Figure 4:
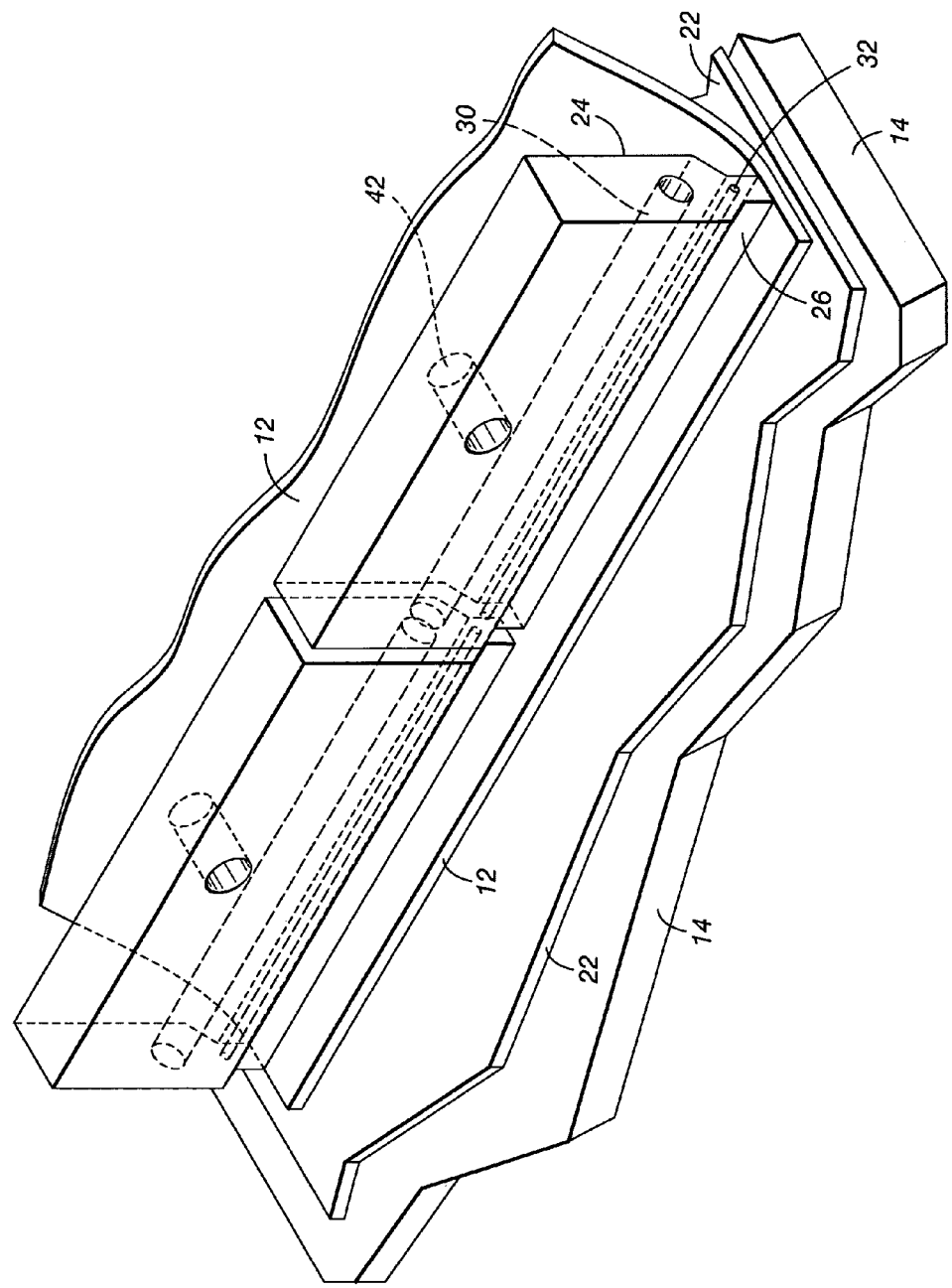
FIG. 4 is a perspective view of two bond shoes, with a portion of the bonding apparatus removed.

Each shoe 24 (see FIGS. 3 and 4) includes a cylindrical heater opening 30 extending along the length of the shoe. The heater opening provides space for a heater (not shown) to be inserted into the shoe. Upon activation, the heater heats the body of the shoe, including the working surface 26. An exemplary heater is an elongate electrical resistance heater. The heater may be similar to a 3 inch, 400 watt, 120 volt heater Part No. 48-0099-00 available from DCI Incorporated of Lenexa, Kans. (though the length of the heater should match the length of the shoe 24). A heater inserted through the heater opening 30 heats the shoe along the entire length of the shoe. Preferably, the heater heats the shoe, and particularly the working surface 26, evenly along the length of the shoe. The ends of adjacent shoes may be extremely close to one another. Therefore, external connections to the heaters of adjacent shoes may be attached to the heaters at opposite ends of the shoes. In some implementations, other access mechanisms through the shoe may provide connections to a heater installed in the bond shoe. In addition, those skilled in the art will recognize that other shapes of heaters can be accommodated in shoe heater openings of different shapes.

Each shoe also includes a sensor opening 32. The sensor opening also extends along the length of the shoe, substantially parallel to the heater opening. The sensor opening receives a temperature sensor, such as an elongate thermocouple. An exemplary thermocouple is Part No. 47-0037-00 from DCI Incorporated of Lenexa, Kans. The temperature sensor in the sensor opening allows monitoring of the temperature of the shoe. In an example, the sensor opening 32 is near the working surface 26 so that the temperature sensor can particularly sense the temperature of the shoe near the working surface. Those skilled in the art will recognize that other shapes and installations of temperature sensors can be used.

Each shoe 24 is independently driven by an associated tool press 34 that presses the shoe downward, toward the surface of the fixture, so that the working surface 26 of the shoe can apply force to the flexible circuit film 12 (FIGS. 1 and 2). An exemplary tool press is an air cylinder. The air cylinder uses pneumatic pressure to extend and retract one or more shafts 36, 37. In one example, a 1.5 inch (3.8 cm) three-stage air cylinder is used. The shoe 24 is attached to the tool press 34 by an attachment device, such as a clamp 38. The clamp 38 is secured to the ends of the shafts 36, 37, and mechanically linked to the shoe so that longitudinal movement of the shafts produces movement of the shoe toward or away from the surface of the fixture 20. The mechanical linkage between the shoe and the clamp 38 is adjustable so that the position of the shoe can be adjusted to ensure the working surface 26 of the shoe makes even contact with the flexible circuit film. An exemplary clamp 38 is U-shaped, with an internal width between its legs approximately equal to the width of the shoe 24. The clamp includes a cylindrical pivot pin 40 that extends between the legs of the clamp. The pivot pin 40 fits through a cylindrical pivot pin opening 42 across the width of the shoe 24 so that the shoe has a limited range of pivot movement. This pivot movement permits the apparatus operator to adjust the angle of the working surface of the shoe relative to the plane of the surface of the fixture 20. Set screws 44 extend through the clamp 38 to press against a lateral side of the shoe 24 to hold the position of the shoe.

A press controller (not shown) controls the operation of the tool press 34 and the heater in the heater opening 30. The press controller receives temperature information from the temperature sensor in the sensor opening 32. The press controller may be a special purpose controller, or a programmed general purpose controller, such as a microprocessor. A single press controller may control multiple of the tool presses, each driving its own shoe 24, or each tool press 34 may have its own independent press controller. One press controller is a DCI 9000 Controller (Part No. 01-0138-00) from DCI Incorporated of Lenexa, Kans.

The bonding apparatus 10 is usable to bond the flexible circuit film 12 to the electronic circuit board 14 in a manner that provides electrical conductivity between arrays of film surface traces or contact pads 16 and corresponding arrays of board surface traces or contact pads 18. The bonding apparatus permits bonding multiple arrays of surface traces either simultaneously or in rapid succession, without repositioning either the flexible circuit film and the electronic circuit board, or the shoes of the bonding apparatus.

The positions of the shoes 24 are adjusted in the clamp 38 by pivoting each shoe about the pivot pin 40 until that the face of the working surface 26 is parallel the upper surface of the fixture 20. The position of each shoe is fixed with the set screws 44. The electronic circuit board 14 is positioned and secured to the fixture 20 so that the arrays of board surface traces are directly below the working surfaces 26 of the corresponding shoes 24.

The anisotropic conductive film 22, which is stored at a substantially lowered temperature, such as −40° C. (−40° F.), is brought from storage. The temperature of the anisotropic conductive film 22 is gradually raised to a standard room temperature of approximately 20-22° C. (68-72° F.), and the anisotropic conductive film is placed over the board surface traces 18 on the electronic circuit board 14. The anisotropic conductive film 22 is lightly attached, or "tacked," to the electronic circuit board 14 over each array of board surface traces 18. The tacking operation includes heating each bond shoe to a tacking temperature, and pressing each shoe 24 against the anisotropic conductive film with a tacking force. Typically, the tacking temperature and the tacking force are less than the temperature and force required to securely attach the anisotropic conductive film to the electronic circuit board. The tacking temperature, the tacking force, and the tacking time are functions of the material of the inflexible substrate and the material of the joining layer. In an example in which the inflexible substrate is a circuit board of conventional circuit board material, and the joining layer is Hitachi AC2052P45 anisotropic conductive film, each shoe 24 has a tacking temperature of 72° C. (160° F.). In an example in which the inflexible substrate is glass, the tacking temperature is higher. The tool press applies sufficient force to the shoe to press the anisotropic conductive film 22 against the surface of the electronic circuit board with a pressure of approximately 80-85 psi, such as 82.1 psi, for a tacking time of approximately 15 seconds. The tacking time may include time for the heater to raise the temperature of the working surface 26 to the appropriate tacking temperature. In one example, a total tacking time includes 10 seconds of temperature rise time, and 5 seconds at the tacking temperature.

After the joining layer of anisotropic conductive film is tacked to the electronic circuit board, the controller causes the tool press to raise the shoe from the joining layer. The anisotropic conductive film and the electronic circuit board are allowed to cool to approximately room temperature.

The flexible circuit film 12 is positioned on the anisotropic conductive film joining layer 22 so that the arrays of film surface traces are aligned with the corresponding arrays of board surface traces 18. Those skilled in the art recognize that such alignment can be provided by providing either the fixture 20 or the electronic circuit board with alignment pins (not shown), and providing the flexible circuit film with corresponding alignment openings (not shown) that mate with the fixture or board alignment pins.

After the electronic circuit board 14 and the flexible circuit film 12 are positioned, with the joining layer of anisotropic conductive film 22 between them, the anisotropic conductive film is bonded to both the electronic circuit board and the flexible circuit film. The anisotropic conductive film is bonded between the electronic circuit board and the flexible circuit film so that the anisotropic conductive film is significantly compressed between each board surface trace and the corresponding film surface trace. Such compression of the anisotropic conductive film causes the anisotropic conductive film to become conductive between each board surface trace and its corresponding film surface trace, but remain substantially insulating between adjacent surface traces.

The tool press 34 causes the working surface 26 of the bond shoe 24 to apply to the upper surface of the flexible circuit film 12 a bonding force at a bonding temperature to bond the anisotropic conductive film between the flexible circuit film and the electronic circuit board. The heater in the heater opening 30 raises the temperature of the shoe 24 (including the working surface 26) to the bonding temperature. The bonding temperature is a function of the materials of the anisotropic conductive film, the flexible circuit film, and the electronic circuit board. In an example using Hitachi AC2052P35 anisotropic conductive film, heating each bond show to approximately 300-350° C. (575-650° F.) takes about 10 seconds. Such a bond shoe temperature during the bonding process (with the bond shoe pressing against the flexible circuit film, anisotropic conductive film, and electronic circuit board) produces a bondline temperature at the anisotropic conductive film of approximately 145-180° C. (290-360° F.). The tool 34 presses the bond shoe toward the surface of the fixture. The force applied is sufficient that the bond shoe presses the assembled flexible circuit film, anisotropic conductive film, and electronic circuit board with a bonding pressure of 140-150 psi. The tool continues to apply this force for approximately 20 seconds after the bond shoe has reached its bonding temperature.

In an example, the bonding apparatus lowers and heats two or more bond shoes simultaneously onto different sections of the flexible circuit film for each of the tacking and bonding steps. In another example, the two or more bond shoes are operated sequentially, but without moving the circuit elements 12, 14 on the fixture 20, and without moving the fixture. The combined arrays of board surface traces 18 may be 7-9 inches or more in length. The fixture surface may be at least 7-9 inches long to accommodate an electronic circuit board having such an array of board surface traces. The ability to bond multiple sections of surface traces without adjusting the position of either the fixture or the bond shoe between sections essentially eliminates misalignment, buckling, or warping. In another example, the fixture 20 is translatable longitudinally relative to the bond shoes. One bond shoe 24 is used for tacking the anisotropic conductive film to the electronic circuit board, and the second bond shoe is used for bonding the anisotropic conductive film to the flexible circuit film and the electronic circuit board. In that arrangement, the one bond shoe can be performing a tacking operation on one array of surface traces while the adjacent bond shoe is performing a bonding operation on an adjacent array of surface traces. Such simultaneous operation allows for a higher net throughput for bonding than is possible if a single bond shoe performs both tacking and the bonding operations for each array of surface traces.

This arrangement is exemplary only. Other types of bond shoes and electronic circuits can be used, such as differently shaped bond shoes or heating elements or a composition of a flexible circuit and a glass electronic circuit (LCD).

We claim:

1. A bonding apparatus for electrically joining a first circuit bearing substrate having a first array of conductive surface traces to a second circuit bearing substrate having a second array of conductive surface traces, the bonding apparatus comprising:

a fixture having a fixture surface, the fixture surface having a first portion and a second portion;

first and second bond shoes, each bond shoe having a working surface with lateral dimensions that are equal to or greater than lateral dimensions of at least one array of conductive surface traces on a first circuit bearing substrate supported on the first portion of the fixture surface;

a first tool press having a shaft and an attachment device secured to the shaft of the first tool press. the attachment device being configured to receive a portion of the first bond shoe, the attachment device being connected to the first bond shoe by a mechanical linkage to enable adjustment of an angle of the first bond shoe with reference to the first portion of the fixture surface, the first tool press being operable to press the first bond shoe toward the first portion of the fixture surface selectively; and a second tool press having a shaft and an attachment device secured to the shaft of the second tool press, the attachment device being configured to receive a portion of the second bond shoe, the attachment device being connected to the second bond shoe by a mechanical linkage to enable adjustment of an angle of the second bond shoe with reference to the second portion of the fixture surface, the second tool press being operable to press the second bond shoe toward the second portion of the fixture surface selectively, the first tool press and the second tool press being configured to drive the first bond shoe and the second bond shoe independently of one another;

the first tool press is configured to pressurize fluid to drive the first bond shoe toward the first portion of the fixture surface with a force, which is sufficient to tack a second circuit bearing substrate having a second array of conductive surface traces to the first circuit bearing substrate with a joining layer; and the second tool press is configured to pressurize fluid to drive the second bond shoe toward the second portion of the fixture surface with a force, which is greater than the force generated by the first tool press and which is sufficient to bond the second circuit bearing substrate to the first circuit bearing substrate with the joining layer after the second circuit bearing substrate has been tacked to the first circuit bearing substrate with the joining layer.

2. The bonding apparatus of claim 1, the first and the second tool presses further comprising:

a first air cylinder for pressurizing air to drive the first bond shoe; and a second air cylinder for pressurizing air to drive the second bond shoe.

3. The bonding apparatus of claim 1, wherein the first and second portions of the fixture surface do not overlap.

4. The bonding apparatus of claim 3, wherein the first and second portions of the fixture surface are substantially adjacent one another.

5. The bonding apparatus of claim 4, wherein the first and second bond shoe faces are separated from one another by no more than 0.25 inch.

6. The bonding apparatus of claim 5, wherein:

the first portion of the fixture surface has a first surface contour;

the first bond shoe has a first bond shoe face having the complement of the first surface contour;

the second portion of the fixture surface has a second surface contour; and the second bond shoe has a second bond shoe face having the complement of the second surface contour.

7. The bonding apparatus of claim 5, wherein:

the first bond shoe face has a length of less than 5 inches; and the second bond shoe face has a length of less than 5 inches.

8. The bonding apparatus of claim 7, wherein the first and second portions of the fixture surface have a combined length of at least 7 inches.

9. The bonding apparatus of claim 3, wherein:

the first portion of the fixture surface has a first surface contour;

the first bond shoe has a first bond shoe face having the complement of the first surface contour;

the second portion of the fixture surface has a second surface contour; and the second bond shoe has a second bond shoe face having the complement of the second surface contour.

10. The bonding apparatus of claim 9, wherein the first and second surface contours are planar.

11. The bonding apparatus of claim 10, wherein:

the first bond shoe face has a length of less than 5 inches; and the second bond shoe face has a length of less than 5 inches.

12. The bonding apparatus of claim 1, wherein each of the bond shoes includes a heater opening for receiving a heater element.

13. The bonding apparatus of claim 12, wherein each of the bond shoes includes a sensor opening for receiving a temperature sensor.

14. The bonding apparatus of claim 1 wherein the attachment device secured to the shaft of the first tool press and the attachment device secured to the shaft of the second tool press are U-shaped clamps.

15. The bonding apparatus of claim 14 in which the U-shaped clamps are configured to receive the portion of the bonding shoe between legs of the U-shaped clamp.

16. The bonding apparatus of claim 15 wherein the mechanical linkage is a pivot pin that limits a range of pivot movement for the bonding shoe.

* * * * *